(12) United States Patent
Mutyala et al.

(10) Patent No.: US 11,600,468 B2
(45) Date of Patent: Mar. 7, 2023

(54) MULTI CHANNEL SPLITTER SPOOL

(71) Applicant: Applied Materials, Inc., Santa Clara, CA (US)

(72) Inventors: Madhu Santosh Kumar Mutyala, Santa Clara, CA (US); Sanjay G. Kamath, Fremont, CA (US); Deenesh Padhi, Sunnyvale, CA (US); Arkajit Roy Barman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 476 days.

(21) Appl. No.: 16/748,632

(22) Filed: Jan. 21, 2020

(65) Prior Publication Data
US 2020/0251310 A1 Aug. 6, 2020

Related U.S. Application Data

(60) Provisional application No. 62/801,593, filed on Feb. 5, 2019.

(51) Int. Cl.
*H01J 37/32* (2006.01)
*H01L 21/67* (2006.01)
(Continued)

(52) U.S. Cl.
CPC .. *H01J 37/32449* (2013.01); *C23C 16/45561* (2013.01); *H01L 21/67017* (2013.01); *H05B 1/0233* (2013.01)

(58) Field of Classification Search
CPC ............ H01J 37/32449; H01J 37/3244; C23C 16/45561; C23C 16/402; C23C 16/45574;
(Continued)

(56) References Cited

U.S. PATENT DOCUMENTS 6,508,913 B2  1/2003  McMillin et al.
7,452,827 B2  11/2008 Gianoulakis et al.
(Continued)

FOREIGN PATENT DOCUMENTS

CN    104181260 A      12/2014
JP    H07335643 A  *  12/1995
(Continued)

OTHER PUBLICATIONS

International Search Report and Written Opinion dated May 25, 2020 for Application No. PCT/US2020/014428.

*Primary Examiner* — Jeffrie R Lund
(74) *Attorney, Agent, or Firm* — Patterson + Sheridan, LLP

(57) ABSTRACT

Embodiments described herein relate to gas line systems with a multichannel splitter spool. In these embodiments, the gas line systems will include a first gas line that is configured to supply a first gas. The first gas line is coupled to a multichannel splitter spool with a plurality of second gas lines into which the first gas flows. Each gas line of the plurality of second gas lines will have a smaller volume than the volume of the first gas line. The smaller second gas lines will be wrapped by a heater jacket. Due to the smaller volume of the second gas lines, when the first gas is flowed through the second gas lines, the heater jacket will sufficiently heat the first gas, eliminating the condensation induced particle defects that occur in conventional gas line systems when the first gas meets with a second gas in the gas line system.

20 Claims, 3 Drawing Sheets

(51) Int. Cl.
*H05B 1/02* (2006.01)
*C23C 16/455* (2006.01)

(58) Field of Classification Search
CPC .......... C23C 16/505; C23C 16/455–16/45597; H01L 21/67017; H05B 1/0233
See application file for complete search history.

(56) References Cited

U.S. PATENT DOCUMENTS

| | | | |
|---|---|---|---|
| 7,674,352 B2* | 3/2010 | Bour | C23C 16/45572 156/345.34 |
| 8,122,850 B2* | 2/2012 | Hishiya | H01L 21/02164 118/724 |
| 8,147,786 B2* | 4/2012 | Tsuda | C23C 16/4412 427/255.39 |
| 9,719,169 B2* | 8/2017 | Mohn | H01L 21/68785 |
| 2001/0035127 A1* | 11/2001 | Metzner | C23C 16/4557 118/725 |
| 2003/0084848 A1 | 5/2003 | Long | |
| 2004/0025370 A1* | 2/2004 | Guenther | C23C 16/4481 34/576 |
| 2005/0061245 A1* | 3/2005 | Kim | C23C 16/4412 118/715 |
| 2006/0196421 A1* | 9/2006 | Ronsse | C23C 16/4481 118/715 |
| 2008/0124463 A1* | 5/2008 | Bour | C23C 16/45572 118/728 |
| 2017/0107620 A1* | 4/2017 | Sugiura | H01L 21/67017 |
| 2018/0087709 A1* | 3/2018 | Ohno | F16L 59/143 |
| 2018/0120822 A1* | 5/2018 | Asai | C23C 16/46 |
| 2020/0251310 A1* | 8/2020 | Mutyala | H05B 1/0233 |

FOREIGN PATENT DOCUMENTS

| | | | | |
|---|---|---|---|---|
| JP | 2009224590 A | * | 10/2009 | ........... C23C 16/448 |
| KR | 10-2003-0069703 A | | 8/2003 | |
| KR | 20100132599 A | * | 12/2010 | |

* cited by examiner phone # MULTI CHANNEL SPLITTER SPOOL

CROSS-REFERENCE TO RELATED APPLICATIONS

This application claims priority to U.S. Provisional Patent Application No. 62/801,593, filed Feb. 5, 2019, which is herein incorporated by reference in its entirety.

BACKGROUND

Field

Embodiments described herein generally relate to gas line systems for use in semiconductor process chambers and, more particularly, to gas line systems with multichannel splitter spools for use in semiconductor process chambers.

Description of the Related Art

As semiconductor devices have progressed into very small technology process nodes and the number of layers in memory devices have increased, particle specifications have gotten tighter with each node. Additionally, a significant process overhead during processing of semiconductor devices involves incoming gas flow with no RF/plasma applied. Therefore, it is important to have the incoming gas flow to be well within particle specification.

Deposition of compounds such as silicon oxide ($SiO_2$) can involve a reaction of gases such as tetraethyl orthosilicate (TEOS) with oxygen ($O_2$) in the presence of an RF bias applied between electrodes on a faceplate and pedestal of a semiconductor process chamber. During the transport of TEOS and $O_2$ from the gas sources to the deposition chamber, the gases each flow through a separate heated gas line and eventually join and meet in an additional separate gas line before entering the process chamber. The pressure in the gas lines is much higher than the pressure in the process chamber. Under the higher pressure conditions observed in the gas lines, flowing excess amount of $O_2$ often leads to insufficient heating of the $O_2$ gas. Therefore, when the colder $O_2$ gas meets the heated TEOS gas in the gas line, condensation occurs within the gas line which eventually results in particle generation due to the gas phase reaction between TEOS and $O_2$ at low temperatures and high pressures.

Conventional gas lines are heated by heater jackets. However, due to limitations in conventional heater jackets, the heater jackets do not provide the amount of heating necessary to prevent condensation and the resulting particle generation from occurring when larger amounts of $O_2$ are flowed. Larger amounts of $O_2$ are mandatory in several process applications due to its better stress, refractive index, and higher deposition rate.

Accordingly, there is a need for a gas line system that provides sufficient heating of gases before entering the process chamber.

SUMMARY

One or more embodiments described herein generally relate to systems of gas lines for processing chambers and systems for processing a semiconductor substrate.

In one embodiment, a system of gas lines for a process chamber includes a first gas line having a first diameter; a spool with a plurality of second gas lines coupled to the first gas line, each of the plurality of second gas lines having a second diameter; and a heater jacket surrounding the spool; wherein the first diameter is larger than the second diameter.

In another embodiment, a system of gas lines for supplying a gas to a process chamber includes a first gas line configured to transport a first gas, the first gas line having a first diameter; a spool with a plurality of second gas lines coupled to the first gas line, each of the plurality of second gas lines configured to transport the first gas, and each of the plurality of second gas lines having a second diameter; a third gas line configured to transport a second gas; a fourth gas line coupled to the spool at a first junction and coupled to the third gas line at a second junction; and a heater jacket surrounding the spool, the third gas line, and the fourth gas line; wherein the second diameter is smaller than the first diameter; and wherein the heater jacket is configured to heat the plurality of second gas lines, the third gas line, and the fourth gas line at substantially similar temperatures.

In another embodiment, a system for processing a semiconductor substrate includes a process chamber; a first gas line configured to transport a first gas, the first gas line having a first diameter; a spool with a plurality of second gas lines coupled to the first gas line, each of the plurality of second gas lines configured to transport the first gas and each of the plurality of second gas lines having a second diameter; a third gas line configured to transport a second gas; a fourth gas line coupled to the spool at a first junction, coupled to the third gas line at a second junction, and coupled to the process chamber at a third junction; and a heater jacket surrounding the spool, the third gas line, and the fourth gas line; wherein the second diameter is smaller than the first diameter; and wherein the heater jacket is configured to heat the plurality of second gas lines, the third gas line, and the fourth gas line at substantially similar temperatures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to gas line systems with a multichannel splitter spool. In these embodiments, the gas line systems include a first gas line that is configured to supply a first gas. The first gas line is coupled to a multichannel splitter spool with a plurality of second gas lines into which the first gas flows. Each of the plurality of second gas lines will have a smaller volume than the volume of the first gas line. The smaller second gas lines will be wrapped by a heater jacket. Due to the smaller volume of the second gas lines, when the first gas such as $O_2$ is flowed through the second gas lines, the heater jacket will sufficiently heat the first gas.

In some embodiments, an additional third gas line is configured to supply a second gas, such as TEOS. The second gas then meets with the first gas in a fourth gas line coupled to both the third gas line and the spool. Each of the second gas lines, the third gas line, and the fourth gas line are surrounded by the heater jacket. The design of the plurality of second gas lines is designed such that the heater jacket heats the first gas to a substantially similar temperature as the second gas. Therefore, when the first gas and the second gas meet in the fourth gas line, the first gas does not cool down the second gas at the intersection of the two gases. Due to the substantially similar temperatures of the first and second gases, condensation is prevented within the fourth gas line where the first and second gases meet, eliminating the condensation induced particle defects that occur in conventional gas line systems.

Figure 1:
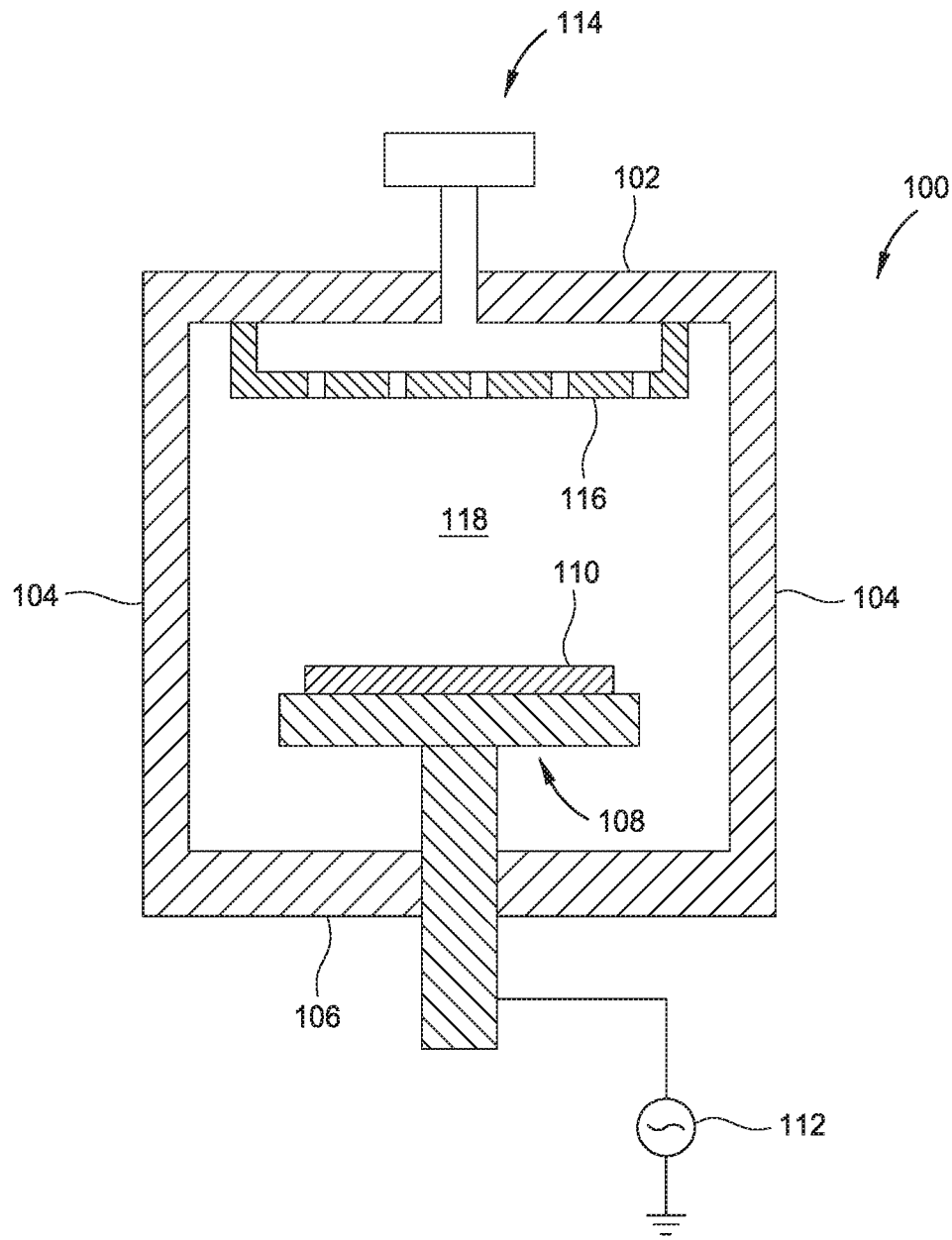
FIG. 1 is a schematic sectional view of a process chamber for processing a semiconductor substrate according to at least one embodiment described in the present disclosure.

FIG. 1 is a schematic sectional view of a process chamber 100 for processing a semiconductor substrate according to at least one embodiment described in the present disclosure. The process chamber 100 includes a top wall 102, side walls 104, and a bottom wall 106 to form an enclosed vacuum. A substrate support 108 is positioned within the process chamber 100. The substrate support 108 supports a substrate 110 which can be placed on a top surface of the substrate support 108. In some embodiments, the substrate 110 may be made of silicon (Si), but can also be made of other similar materials. The substrate support 108 can be heated using a power source 112. A gas line system 114, described in greater detail in FIGS. 2A-2B below, is configured to flow gases into the process chamber 100 through the top wall 102 near a showerhead 116. The showerhead 116 is positioned downwards from the top wall 102 and is designed to control the flow and distribution of gases before entering a process region 118. The process region 118 is located between the showerhead 116 and the substrate support 108. The gases are energized into a plasma state within the process region 118 where they are deposited to form one or more layers on the substrate 110.

Figure 2A:
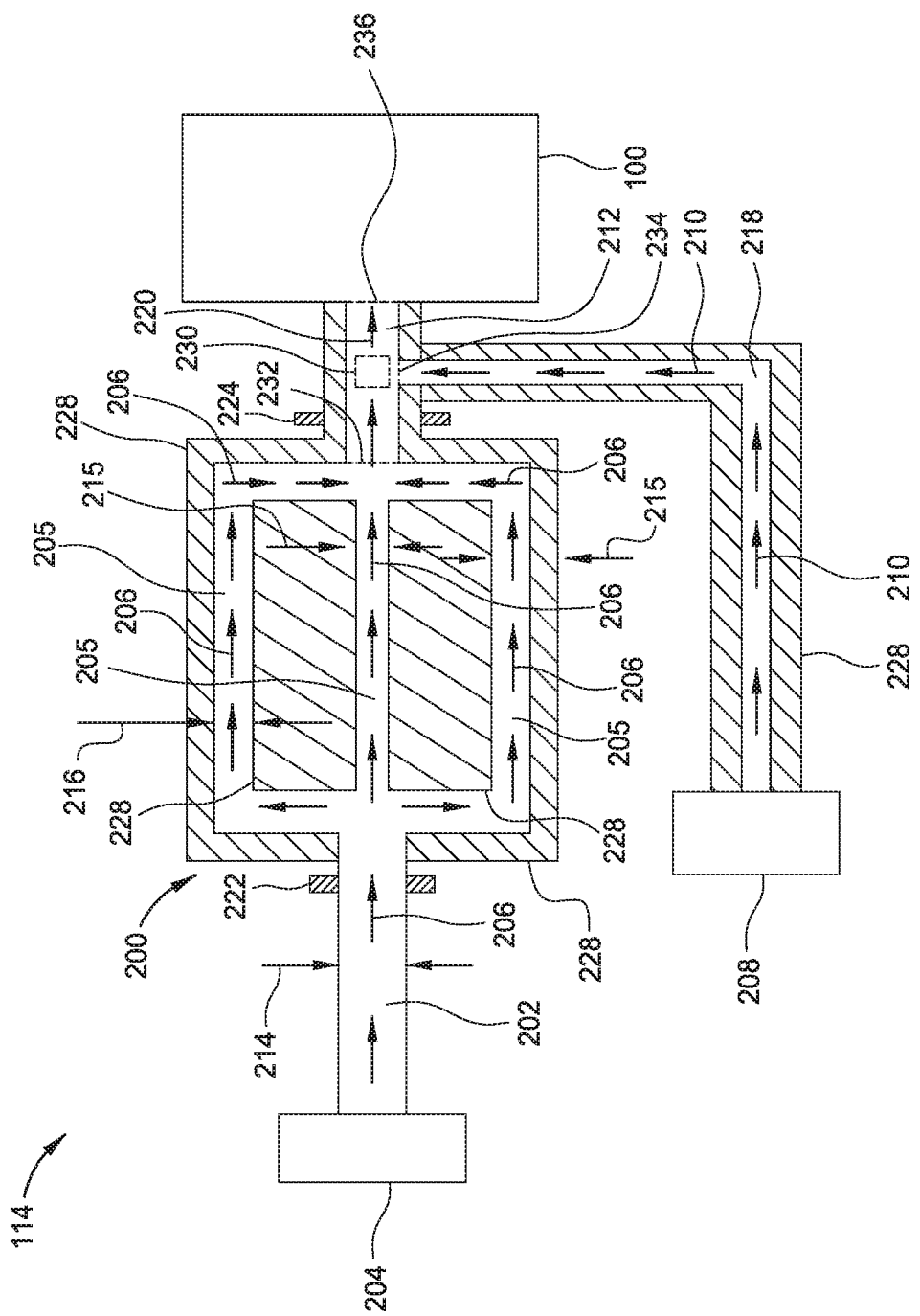
FIG. 2A is a schematic sectional view of the gas line system shown in FIG. 1 according to at least one embodiment described in the present disclosure.
Figure 2B:
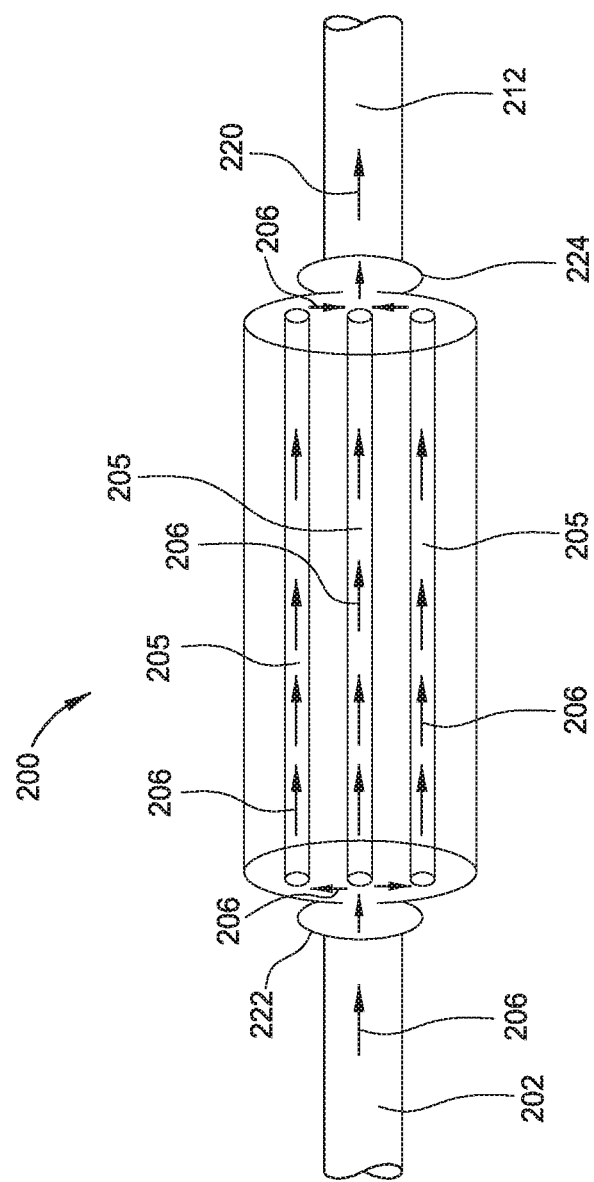
FIG. 2B is a perspective view of the gas line system shown in FIG. 1 according to at least one embodiment described in the present disclosure.

FIG. 2A is a schematic sectional view and FIG. 2B is a perspective view of the gas line system 114 illustrated in FIG. 1 according to at least one embodiment described in the present disclosure. The gas line system 114 includes a first gas line 202 coupled to a spool 200 by a first nut 222. Although the first nut 222 is used for coupling in this embodiment, other coupling means can also be used in embodiments described herein. The spool 200 includes a plurality of second gas lines 205. The first gas line 202 can be about 16.5 inches in length, for example, although other lengths can be used. The second gas lines 205 can be between about 15 inches and about 30 inches in length, for example, although other lengths can be used. A first gas flows from a first gas source 204 into the first gas line 202. The first gas can be flowed at a flow rate of over 15 L/min, and in some embodiments, can be flowed at a flow rate of over 25 L/min. The design of the gas line system 114 as described by embodiments herein allow for larger flow rates of an $O_2$ gas to be used, for example, without particle generation occurring. Larger flow rates are better for use in several process applications due to its better stress, refractive index, and higher deposition rate. Thereafter, the first gas flows from the first gas line 202 into the plurality of second gas lines 205 of the spool 200. The flow of the first gas is shown by a first movement path 206, indicated by the arrows in FIG. 2A. Although the first gas may be $O_2$, other similar gases can be used in the gas line system 114. Additionally, although the spool 200 is split into three second gas lines 205 in FIGS. 2A-2B, the spool 200 can be split to other numbers of second gas lines 205.

The first gas line 202 has a first diameter 214 (i.e., inner diameter) and the second gas lines 205 each have a second diameter 216 (i.e., inner diameter). The first diameter 214 is larger than the second diameter 216. In some embodiments, the first diameter 214 is at least twice the size of the second diameter 216. In other embodiments, the first diameter 214 is at least three times the size of the second diameter 216. For example, in one embodiment, the first diameter 214 is about 0.4 inches and the second diameter 216 is about 0.18 inches. The small diameter of the second diameter 216 creates smaller volumes of the second gas lines 205 in comparison to the volume of the first gas line 202. Due to the smaller volume of the second gas lines 205, when the first gas is flowed through the second gas lines 205, the second gas lines 205 can sufficiently heat the first gas and maintain the first gas at a desired high temperature. A heater jacket 228 is wrapped around the spool 200 and the second gas lines 205 to provide heat to the second gas lines 205. The heater jacket 228 can heat the second gas lines 205 to a temperature of about 175 degrees Celsius (C), although heating up to other temperatures is also possible.

The gas line system 114 includes a third gas line 218. A second gas flows from a second gas source 208 into the third gas line 218. Like the first gas line 202, the third gas line 218 can have a diameter of about 0.4 inches and a length of about 16.5 inches, although other diameters and lengths can be used. The flow of the second gas is shown by a second movement path 210, indicated by the arrows in FIG. 2A. The second gas may be TEOS, although other similar gases can be used in the gas line system 114. The heater jacket 228 can be wrapped around the third gas line 218 in a manner similar to the second gas lines 205 above. The heater jacket 228 can heat the third gas line 218 to a temperature of about 175 degrees Celsius (C), although heating up to other temperatures is also possible. Therefore, the temperature of the third gas line 218 can be heated to a substantially similar temperature as the second gas lines 205, leading to the second gas to be heated to substantially similar temperature as the first gas. For example, each gas may be heated to approximately 175° C. within an acceptable tolerance (e.g., +/−15° C.).

The gas line system 114 includes a fourth gas line 212. The fourth gas line 212 is coupled to the spool 200 at a first junction 232 and is coupled to the third gas line 218 at a second junction 234. The fourth gas line 212 is coupled to the spool 200 on one end by a second nut 224, although other coupling means can be used in embodiments described herein. The fourth gas line 212 is coupled to the process chamber 100 on another end at a third junction 236. The first gas and the second gas flow into the fourth gas line 212. Within the fourth gas line 212, the first gas and second gas meet in a mixing region 230.

As noted above, the second gas lines 205 are heated at substantially similar temperatures as the third gas line 218.

Therefore, when the first gas and the second gas meet in the fourth gas line 212, the first gas does not cool down the second gas at the intersection of the two gases in the mixing region 230. Due to the substantially similar temperatures of the first and second gases, condensation is prevented within the mixing region 230 of the fourth gas line 212. The heater jacket 228 can be wrapped around the fourth gas line 212 in a manner similar to the second gas lines 205 and the third gas line 218 above. The heater jacket 228 can heat the fourth gas line 212 to a temperature of about 175 degrees Celsius (C), although heating up to other temperatures is also possible. Therefore, the fourth gas line 212 is also heated to substantially similar temperature as the second gas lines 205 and the third gas line 218, eliminating the condensation induced particle defects that occur in conventional gas line systems.

Thereafter, the mixed first gas and second gas flow from the fourth gas line 212 into the process chamber 100 at the third junction 236. The total length between the mixing region 230 and the top wall 102 (FIG. 1) of the process chamber 100 can be about 33 inches, or other smaller lengths. The fourth gas line 212 can have a diameter of about 0.4 inches, although other similar diameters can be used. The flow of the mixed gases is shown by a third movement path 220, indicated by the arrows in FIG. 2A. The flow rate of the mixed gases can be a substantially similar flow rate as the flow rate through the first gas line 202. In some embodiments, the flow rate of mixed gases through the fourth gas line 212 can be over 15 L/min, for example. In other embodiments, the flow rate of mixed gases through the fourth gas line 212 can be over 25 L/min, for example. After the mixed gas flow into the process chamber 100, they can be deposited to form layer(s) on the substrate 110 (FIG. 1). The first gas line 202, the second gas lines 205, the third gas line 218, and the fourth gas line 212 can each be made of stainless steel, although other similar materials can be used.

While the foregoing is directed to embodiments of the present disclosure, other and further embodiments of the disclosure may be devised without departing from the basic scope thereof, and the scope thereof is determined by the claims that follow.

We claim:

1. A system of gas lines for a process chamber, comprising:
    a first gas line having a first diameter;
    a spool with a plurality of second gas lines coupled to the first gas line, each of the plurality of second gas lines having a second diameter; and
    a first heater jacket surrounding the spool and a second heater jacket surrounding each of the plurality of second gas lines;
    wherein the first diameter is larger than the second diameter.

2. The system of claim 1, wherein the first diameter is at least twice the size of the second diameter.

3. The system of claim 1, wherein the first diameter is at least three times the size of the second diameter.

4. The system of claim 1, wherein the spool is coupled to the first gas line by a first nut.

5. The system of claim 1, wherein the plurality of second gas lines are between about 15 and about 30 inches in length.

6. A system of gas lines for supplying a gas to a process chamber, comprising:
    a first gas line configured to transport a first gas, the first gas line having a first diameter;
    a spool with a plurality of second gas lines coupled to the first gas line, each of the plurality of second gas lines configured to transport the first gas, and each of the plurality of second gas lines having a second diameter;
    a third gas line configured to transport a second gas;
    a fourth gas line coupled to the spool at a first junction and coupled to the third gas line at a second junction; and
    a first heater jacket surrounding the spool, a second heater jacket surrounding each of the second gas lines, a third heater jacket surrounding the third gas line, and a fourth heater jacket surrounding the fourth gas line;
    wherein the second diameter is smaller than the first diameter; and
    wherein each respective heater jacket is configured to heat the plurality of second gas lines, the third gas line, and the fourth gas line at substantially similar temperatures.

7. The system of claim 6, wherein the first diameter is at least twice the size of the second diameter.

8. The system of claim 6, wherein the first diameter is at least three times the size of the second diameter.

9. The system of claim 6, wherein the first heater jacket is configured to heat the spool to approximately 175 degrees C. and the fourth heater jacket is configured to heat the fourth gas line to approximately 175 degrees C.

10. The system of claim 6, further comprising a first gas source configured to supply the first gas to the first gas line such that the first gas is flowed through the first gas line at a flow rate over 15 L/min.

11. The system of claim 6, further comprising a first gas source configured to supply the first gas to the first gas line such that the first gas is flowed through the first gas line at a flow rate over 25 L/min.

12. The system of claim 6, further comprising a first gas source coupled to the first gas line and configured to supply the first gas, wherein the first gas is $O_2$.

13. The system of claim 6, further comprising a second gas source coupled to the third gas line and configured to supply the second gas, wherein the second gas is TEOS.

14. A system for processing a semiconductor substrate, comprising:
    a process chamber;
    a first gas line configured to transport a first gas, the first gas line having a first diameter;
    a spool with a plurality of second gas lines coupled to the first gas line, each of the plurality of second gas lines configured to transport the first gas and each of the plurality of second gas lines having a second diameter;
    a third gas line configured to transport a second gas;
    a fourth gas line coupled to the spool at a first junction, coupled to the third gas line at a second junction, and coupled to the process chamber at a third junction; and
    a first heater jacket surrounding the spool, a second heater jacket surrounding each of the second gas lines, a third heater jacket surrounding the third gas line, and a fourth heater jacket surrounding the fourth gas line;
    wherein the second diameter is smaller than the first diameter; and
    wherein the heater jacket is configured to heat the plurality of second gas lines, the third gas line, and the fourth gas line at substantially similar temperatures.

15. The system of claim 14, wherein the first diameter is at least twice the size of the second diameter.

16. The system of claim 14, wherein the heater jacket is configured to heat the spool and the fourth gas line to approximately 175 degrees C.

17. The system of claim 14, further comprising a first gas source configured to supply the first gas to the first gas line such that the first gas is flowed through the first gas line at a flow rate over 15 L/min.

18. The system of claim 14, further comprising a first gas source configured to supply the first gas to the first gas line such that the first gas is flowed through the first gas line at a flow rate over 25 L/min.

19. The system of claim 14, further comprising a first gas source coupled to the first gas line and configured to supply the first gas, wherein the first gas is $O_2$.

20. The system of claim 14, further comprising a second gas source coupled to the third gas line and configured to supply the second gas, wherein the second gas is TEOS.

* * * * *